United States Patent [19]
Wilson

[11] Patent Number: 5,119,076
[45] Date of Patent: Jun. 2, 1992

[54] MEASURING SPECTRAL FEATURES USING A CURSOR AND A MARKER

[75] Inventor: Fredrick J. Wilson, Tualatin, Oreg.

[73] Assignee: Tektronix, Inc., Beaverton, Oreg.

[21] Appl. No.: 456,754

[22] Filed: Dec. 26, 1989

[51] Int. Cl.$^5$ .......................... G09G 3/02; G09G 1/06
[52] U.S. Cl. .................................. 340/709; 340/722; 324/77 B; 324/77 R
[58] Field of Search ............... 340/709, 712, 722, 723, 340/724; 324/77 R, 77 B, 121 R; 364/485

[56] References Cited

U.S. PATENT DOCUMENTS

| | | | |
|---|---|---|---|
| 4,302,755 | 11/1981 | Pisani et al. | 340/722 |
| 4,578,640 | 3/1986 | Crook et al. | 340/722 |
| 4,686,523 | 8/1987 | Bristol | 340/722 |
| 4,870,348 | 9/1989 | Smith et al. | 324/77 |
| 4,890,099 | 12/1989 | Takano | 324/77 B |

OTHER PUBLICATIONS

Tektronix, Inc., 2782 Spectrum Analyzer Operator's Manual (P/N 070-6794-00), 1989, pp. 4-9 tp 4-15.
Advantest Corp., R3261/3361 Series Spectrum Analyzer Instruction Manual, 1988, pp. 4-33 and 4-31 to 4-42.
Hewlett-Packard, HP 8593A/8593A Spectrum Analyzer, Jun. 1989, pp. 6-12 to 6-15, 7-9, 7-26, and 7-29 to 7-33.
Tektronix, 2710 Spectrum Analyzer Operator's Manual and User's Guide, 1989, pp. 3-4, 3-5, 4-20, 4-21 and 3-25 to 3-33 and 4-59 to 4-60.
Tektronix 2755/2755P, 2755A/2755AP Spectrum Analyzer Operator's Manual, 1986, pp. 4-7 to 4-9.
Tektronix, 495/495P Spectrum Analyzer Programmer's Manual, Oct. 1987, pp. 5-10 and 5-11.

*Primary Examiner*—Ulysses Weldon
*Assistant Examiner*—M. Fatahi-Yar
*Attorney, Agent, or Firm*—Boulden G. Griffith

[57] ABSTRACT

An improved marker and cursor system for spectral waveform measurement permits the operator to link or unlink a cursor and a marker, allowing them to be used separately or in coordination to make bandwidth measurements. A second reference marker permits measurement of the frequency and amplitude differneces between it and the marker at the same time that the marker is being used control the linked cursor. The cursor can be fixed or linked in a constant positive or negative delta-amplitude relationship to the marker. The points on the cursor where the cursor and spectral waveform intersect are intensified for identification and a readout is provided of the difference in frequency values between these points. Measurements continue even during unstable conditions of the instrument or spectral waveform and fluctuations show up as only minor movements of the intensified points along the cursor. If there is no intersection of the cursor and spectral waveform in one direction, the absolute frequency value of the other intersection is displayed instead of a delta-frequency value.

9 Claims, 5 Drawing Sheets

MEASURING SPECTRAL FEATURES USING A CURSOR AND A MARKER

BACKGROUND OF THE INVENTION

This invention relates to the field of spectrum analysis, and more particularly to the field of measurements of spectral features in a spectrum analyzer display using a cursor and a marker.

Spectrum analyzers are electronic instruments that convert time domain information at their input into frequency domain information at their output. Time domain information describes how the amplitude of an electrical signal varies with time, while frequency domain information describes how the power of the signal is distributed over frequency.

Prior art spectrum analyzers have used markers and/or cursors to assist in spectral measurements. Typically, one marker is placed on the peak of a signal and the frequency and amplitude of the signal at that point are displayed somewhere around the screen. Some spectrum analyzers provide two or more markers that can be used to measure differences between the amplitude and frequency at one point and the amplitude and frequency at another point.

The 49X series of Spectrum Analyzers from Tektronix, Inc. has markers that can be linked together to perform bandwidth measurements. In one mode of operation, these markers automatically go to the −6 dB points on either side of a peak, and a readout displays the frequency difference between the locations of the two markers. Markers can be moved individually or as a linked pair automatically by NEXT PEAK → and ← NEXT PEAK controls. The instrument locates the center of the next peak in the indicated direction and moves the single marker to the top of it or the pair of markers to the −6 dB points on either side of it.

The R3261/3361 Spectrum Analyzers from Advantest also have two markers, which may be linked, and a horizontal cursor. A readout associated with the cursor indicates the amplitude level at the cursor's location and the difference in amplitude levels between the cursor's location and the location of the primary marker. The two markers are linked for bandwidth measurements by a "X dB DOWN" softkey. When the cursors are linked, they must be positioned on the peak of interest and a button pressed to activate a measurement. Each activation produces a single measurement. When one marker is used in conjunction with the cursor, the difference in amplitude levels between the location of the marker and the location of the cursor is displayed. This instrument also has automatic peak searching via ← NEXT PEAK → controls, but there is no way to link the cursor to the markers or to make the linked markers move from peak to peak to perform a sequence of bandwidth measurements.

Also, in the Advantest R3261/3361 Spectrum Analyzers, if the frequency span or center frequency is changed, the markers do not track the moving peak. There are prior art spectrum analyzers from Tektronix, e.g. the 2710 or the 49X analyzers, that automatically track a peak when it or the frame of reference moves, and perform a new calculation as soon as the real or apparent motion of the peak stops for a second or two. However, in all of these spectrum analyzers with markers that can be linked to perform bandwidth measurements, fluctuations in the spectrum being measured can cause the locations of the markers to move up and down vertically by a considerable amount that depends on the steepness of the peak being measured and the resolution of the display.

Because prior art spectrum analyzers place markers based on analysis of amplitude axis information, they must have relatively stable conditions to locate a peak, find the X dB down points and put the markers on them, and then make the frequency axis measurement. It would be preferable to find an approach that would allow measurements to be made continuously, even under more dynamic conditions, such as when signals are fluctuating or instrument settings are being adjusted.

What is desired is an improved marker and cursor system for spectral waveform measurement that permits the operator to link or unlink a cursor and a marker, allowing them to be used separately or in coordination, and that provides a second marker so that additional measurements can be performed when the first marker and the cursor are being used linked together, and that performs bandwidth measurements in a way that keeps the X dB down points stable in the vertical axis despite fluctuations in the shape of the peak being measured, and that continues measuring even under dynamic conditions.

SUMMARY OF THE INVENTION

Accordingly the present invention is an improved marker and cursor system for spectral waveform measurement that permits the operator to link or unlink a cursor and a marker, allowing them to be used separately or in coordination to make bandwidth measurements. A second reference marker permits measurement of the frequency and amplitude differences between it and the marker at the same time that the marker is being used to control the linked cursor. The cursor may be fixed or linked in a constant positive or negative delta-amplitude relationship to the marker. The points on the cursor where the cursor and spectral waveform intersect are intensified for identification and a readout is provided of the difference in frequency values between these points. Measurements continue even during unstable conditions of the instrument or spectral waveform and fluctuations show up as only minor movements of the intensified points along the cursor. If there is no intersection of the cursor and spectral waveform in one direction, the absolute frequency value of the other intersection is displayed instead of a delta-frequency value.

DETAILED DESCRIPTION

Figure 1:
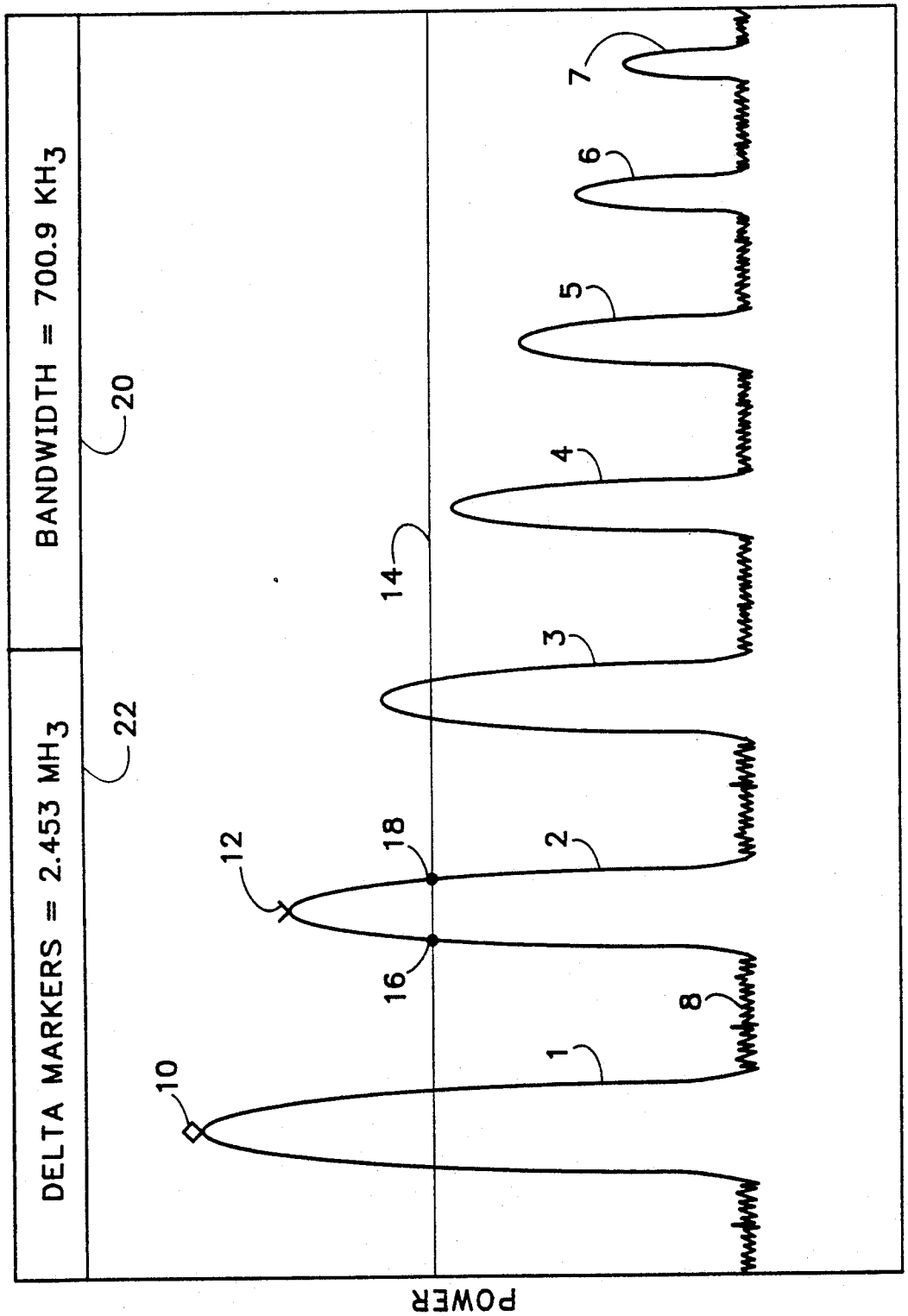
FIG. 1 is a spectrum analyzer display according to the present invention with the cursor below the marker.

Referring to FIG. 1, a sequence of spectral peaks 1–7 rise above a background level of noise 8. A reference marker 10 is positioned at the top of the first peak 1. A marker 12 is positioned at the top of the second peak 2. Cursor 14 is linked to the marker 12, as can be determined by the intensified dots 16 and 18 at the points where the cursor intersects the second peak 2. The bandwidth value measured by the cursor appears at the top right of the display. At the top left of the display, the frequency difference between the marker and the reference marker is provided. Here, these two markers 10 and 12 are shown as having two different shapes, but they may also have the same shape and be distinguished from each other by being made different colors.

Figure 2:
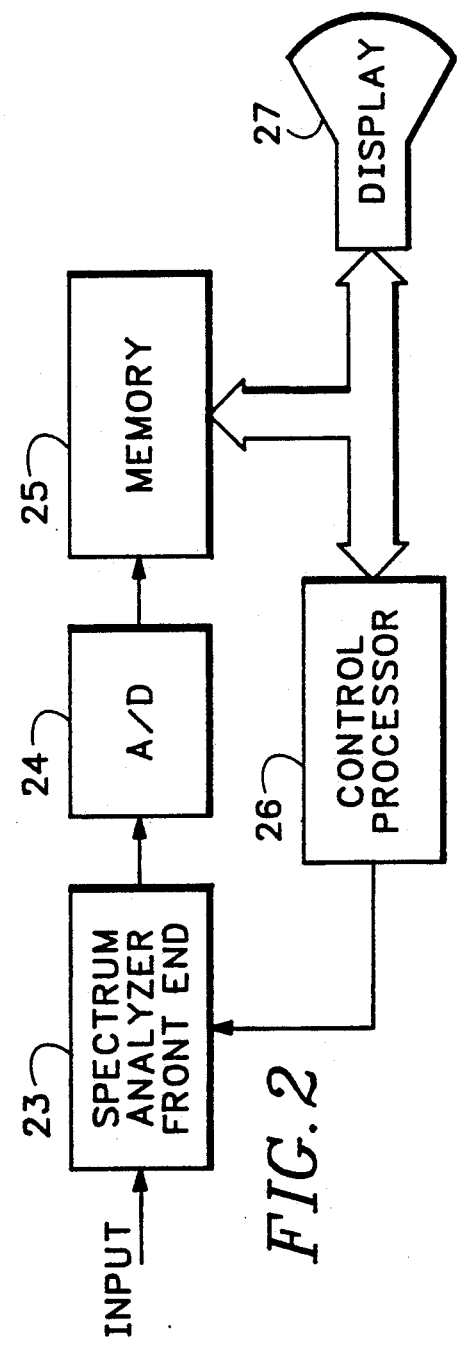
FIG. 2 is a simplified block diagram of a spectrum analyzer.

FIG. 2 is a simplified block diagram of a spectrum analyzer. An input signal is analyzed for its frequency domain content by the spectrum analyzer front end 23. The resulting analog spectral information is converted to corresponding digital information by analog-to-digital converter 24 and stored in memory 25. A control processor 26 performs procedures according to the present invention to make operator controlled measurements of the spectral information in the memory 25 and presents the cursors and markers of the present invention to the operator via display 27.

Figure 3A:
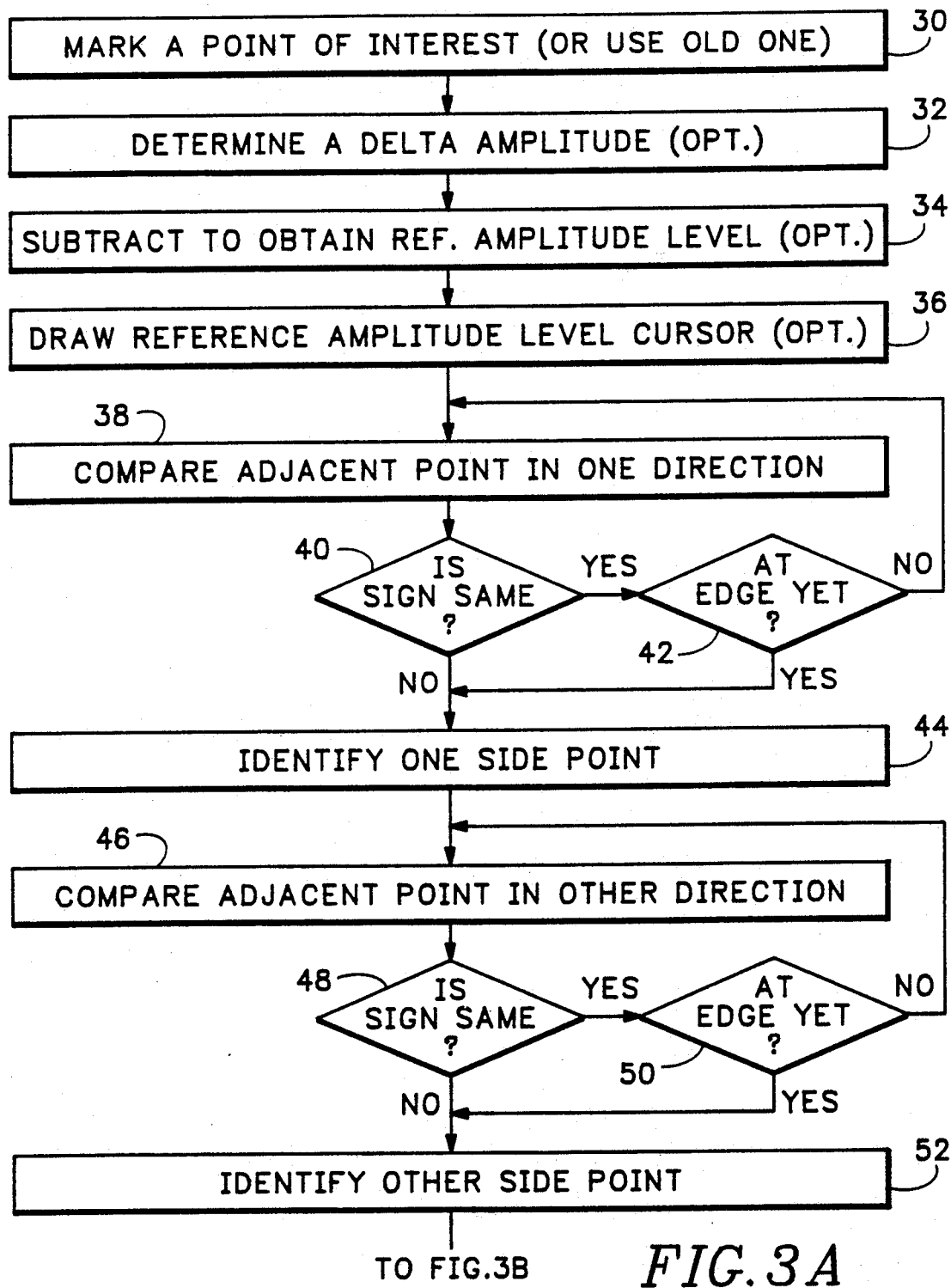
FIGS. 3A and 3B are a logic flow diagram of the procedure used to calculate bandwidths to support the present invention.
Figure 3B:
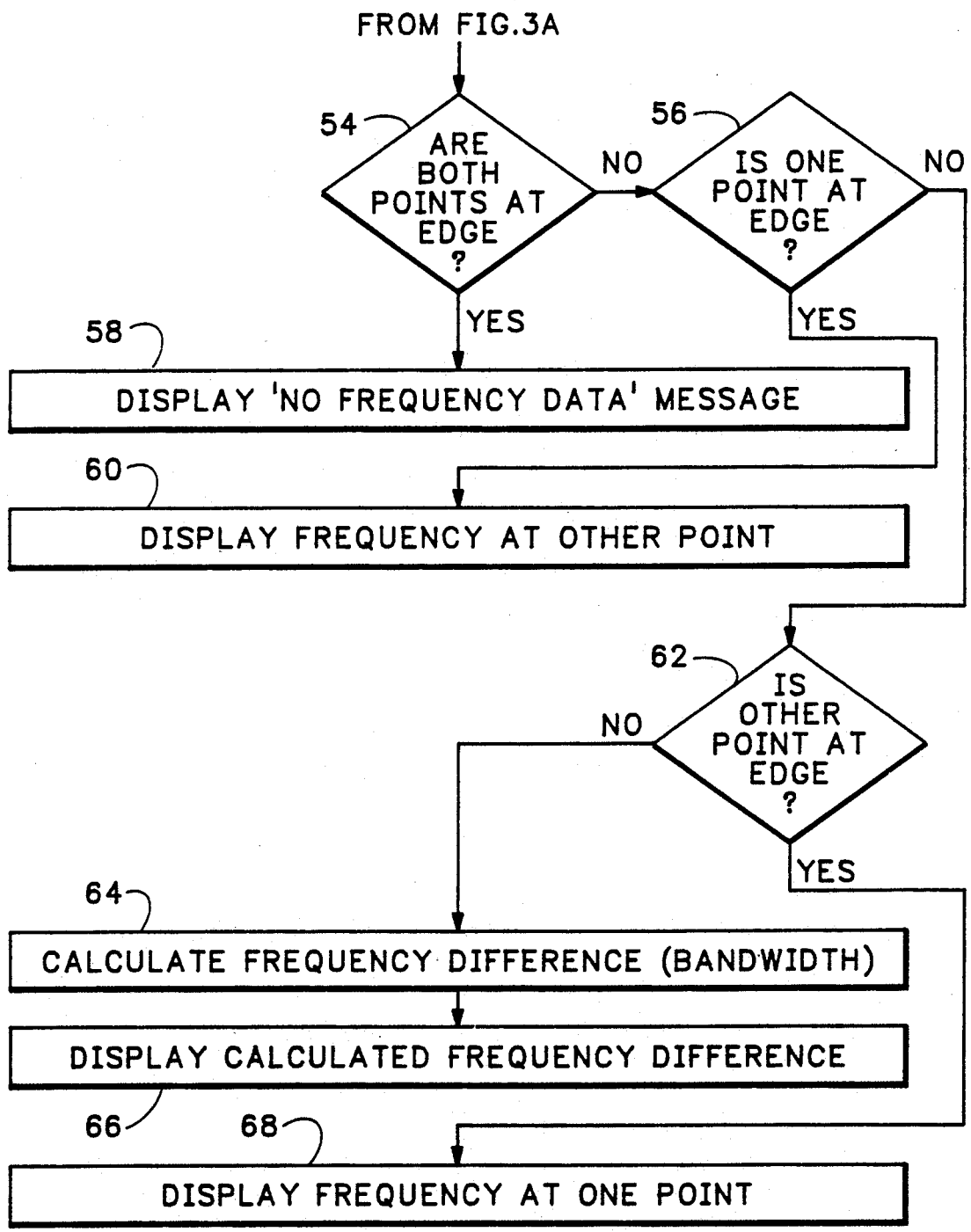

FIGS. 3A and 3B are a logic flow diagram of the procedure used to support the cursor and marker bandwidth measuring system of the present invention. This procedure assumes that the operator has already entered the mode of operation that links cursor 14 to the marker 12. The first step 30 involves operator input of one type or another. The marker may be moved using a knob or other manual means, or may be moved automatically using a peak finding facility of the instrument.

The second step 32 and third step 34 shown in FIG. 3A are optional, depending on whether an "absolute" or "relative" amplitude level is desired for the cursor position. If the operator selects "absolute", he must position the cursor himself, i.e., supply the amplitude level directly that will be the reference amplitude threshold of step four 36. If the operator chooses "relative", a default offset of 6 dB is supplied as the delta amplitude of step two 32. Means are also provided in the user interface for allowing the operator to change the amplitude level difference between the marker 12 and the cursor 14, that is, to change the delta amplitude of step two 32. Operation of the cursor and marker system is further described in the 2782 Spectrum Analyzer Operator's Manual from Tektronix (part number 070-6794-00) which is hereby incorporated by reference.

Figure 4:
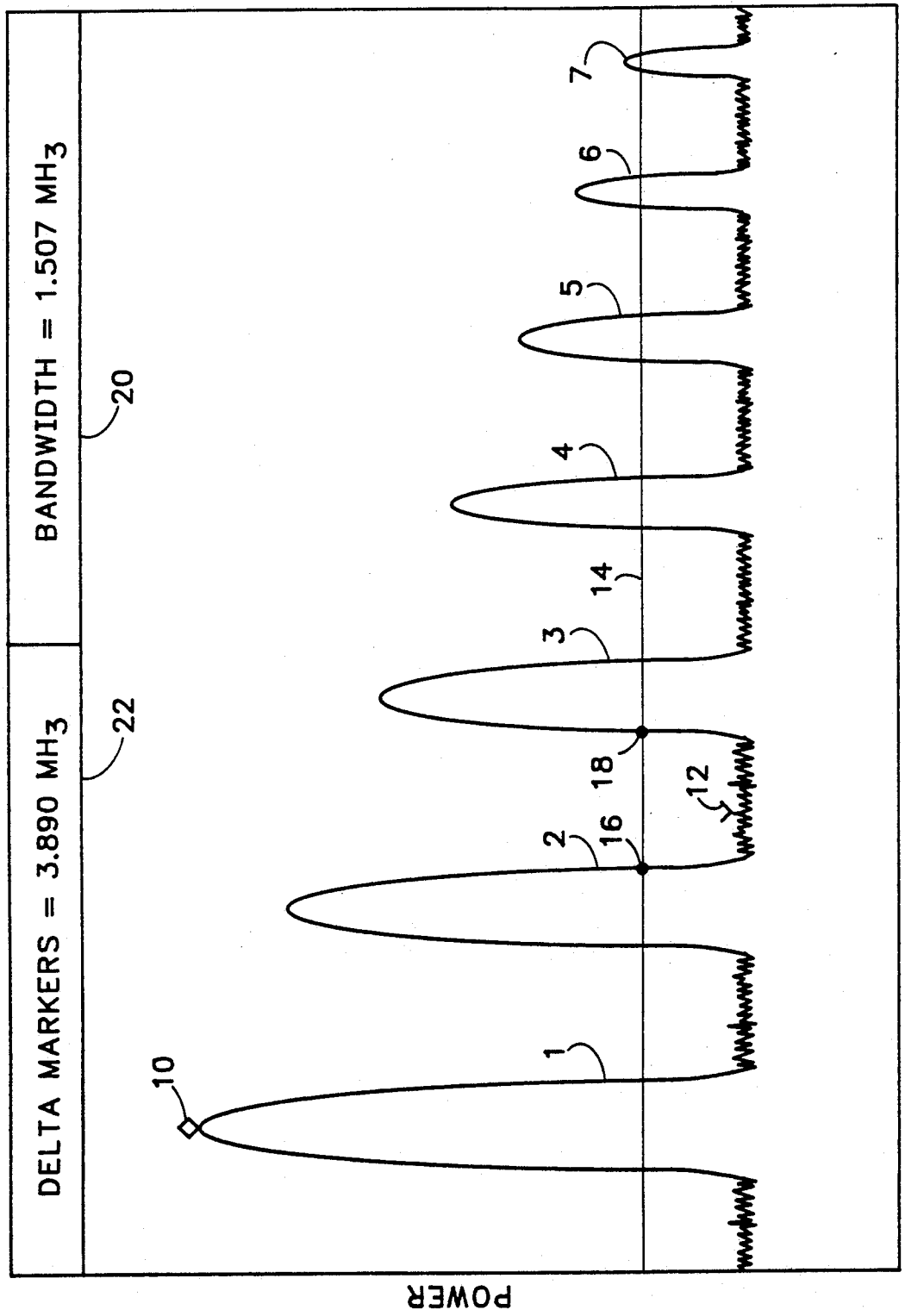
FIG. 4 is a spectrum analyzer display according to the present invention with the cursor above the marker.

Referring to FIG. 4, it should be noted that the relationship between the marker 12 and cursor 14 need not be as shown in FIG. 1, but rather they can be linked for "relative" operation with a negative value of delta amplitude 32 as shown in FIG. 4. And, in the "absolute" mode, the marker 12 and the cursor 14 also frequently get in the relationship shown in FIG. 4 simply because the cursor stays still while the marker is being moved. In either event, the brightened dots 16 and 18 appear at the nearest places in each direction that the spectrum crosses the cursor 14 and the bandwidth readout 20 displays the difference in frequency between these two points.

The third step 34 shown in FIG. 3A is one of subtracting the delta amplitude value from the amplitude level of the location marked in step one 30 to obtain a reference amplitude level against which other amplitude levels are compared later. The fourth step 36 is to draw the cursor 14 at this amplitude level on the screen. This fourth step 36 of drawing the cursor on the screen is also optional in the following sense. The spectrum analyzer could be under remote control and be "faceless", that is, not have a local screen. The methods of this invention could then take place in a "virtual display" locally and the results sent to the remote controller over a bus.

The next three steps 38, 40, and 42 of FIG. 3A, describe the process of moving point by point along the spectral waveform in one direction, while comparing the amplitude value at each point with the reference amplitude level. This process continues until the sign of the result of the comparison changes, step 40, or an edge of the displayed data is encountered, step 42. If the sign of the result of the comparison changes, the spectral waveform has just crossed the reference amplitude threshold. If that point is not exactly at the crossing, then either that point, the first point past the crossing, or the preceding point, the last point before the crossing, can be used as the location along the frequency axis to be identified on the cursor as the intersection between the cursor and the spectral waveform. The difference between two adjacent points is generally insignificant in a display of a thousand or more points. The identification of the other side point, in the loop of steps 46, 48, and 50, is accomplished in the same manner.

One way to identify the points 16 and 18 according to steps 44 and 52, is to brighten or enlarge them, as is shown in FIGS. 1 and 3A although other means could be used. It should be noted that the point which is identified, by brightening or other means, is the point on the cursor corresponding to the frequency of the point on the spectral waveform either immediately before, at, or after the calculated intersection. Because the point identified for the operator is always on the cursor, that is at the amplitude value of the cursor along the amplitude axis, fluctuations in the underlying spectrum cause the position of the crossing points to change slightly along the frequency axis.

This behavior is in contrast to that of the spectrum analyzers of the prior art that use a pair of linked markers to perform bandwidth measurements. In those analyzers, especially with sharp spectral peaks, fluctuations in the underlying spectra show up as significant and sometimes disconcerting motions of the markers up and down on the amplitude axis. These wobble up and down independently as they move to the point on the spectral waveform that is closest to the amplitude level that they are looking for. With the cursor system of the present invention, the intensified points are fixed in amplitude so they can not move about vertically. And, because peaks generally have steep slopes, any movement of the identified spots horizontally is much less dramatic and disconcerting than the larger vertical motion of the prior art markers.

If an edge of the display is encountered by step 42 before a change in the sign of the result of the comparison is detected by step 40, the point which is identified in step 44 is the point at the edge of the screen at the reference amplitude.

When an edge of the display is encountered instead of a crossing, any resulting bandwidth calculation is meaningless. Under these circumstances, the most useful value that the instrument can display is the absolute frequency of the other crossing point, if there is one. Thus, when step 42 exits in the "YES" direction, if step 50 always exits in the "NO" direction, then step 54 will exit in the "NO" direction and step 56 will exit in the "YES" direction, and the frequency of the other side point will be displayed according to step 60. Conversely, if step 42 always exits in the "NO" direction but step 50 exits in the "YES" direction, then step 54 will again exit in the "NO" direction, step 56 will exit in the "NO" direction and step 62 will exit in the "YES" direction, so that the frequency of the one point is displayed according to step 68.

The behavior of the cursor as just described permits useful measurements to be made with this cursor even if there is only one intersection of the spectral waveform and the cursor. For instance, in characterizing a filter's shape, one can make a series of measurements of the general type: "What is the (absolute) frequency at this particular amplitude level?".

If the search for a crossing fails to detect one in either direction, that is steps 42 and 50 both exit in the "YES" direction, step 54 will exit in the "YES" direction and a message such as "No Frequency Data" or "Not Active" is displayed instead of a frequency according to step 58.

The foregoing behavior of the cursor system of the present invention can be used to monitor a displayed frequency span for intermittent or spurious spectral features that exceed a threshold. The cursor is put at the threshold, and because the displayed span does not normally produce a spectral event of the amplitude at which the cursor is placed, the two identified points are at the sides of the screen. As soon as an intermittent or spurious signal exceeds that threshold, one or both of the bright spots jump from the side of the display to the point where the intermittent or spurious spectral feature crosses the threshold, thereby calling the attention of the operator to the occurrence.

The sweep speed of the spectrum analyzer front end 23 is generally slow compared with the refresh rate of the display 27. The calculations and other activities of steps 36 to 68 are all updated with every refresh of the display screen, but the difference frequency display 20 is only updated every time another sweep of the spectrum is completed. The difference frequency display 20 could be updated with every refresh of the screen instead, but that would make it too unstable and difficult to read if the display is changing significantly between successive sweeps.

While a preferred embodiment of the present invention has been shown and described, it will be apparent to those skilled in the art that many changes and modifications may be made without departing from the invention in its broader aspects. The claims that follow are therefore intended to cover all such changes and modifications as fall within the true spirit and scope of the invention.

I claim:

1. A spectrum analyzer display system for providing spectral information in the form of a graph having a frequency axis and an amplitude axis, the display system comprising:
   memory means for storing pairs of amplitude values and frequency values defining points on the graph;
   display means for displaying the graph of the stored points;
   a marker movable along the frequency axis of the display means for marking a point of interest on the graph;
   a cursor movable along the amplitude axis of the display means for identifying an amplitude level; and
   controlling means for permitting an operator to control the locations of the marker and the cursor and, optionally, for allowing an operator to link the cursor to the marker in a definable constant delta-amplitude relationship, the controlling means having the further functions of locating and identifying a point on the cursor corresponding to a nearest intersection of the cursor and the graph in one direction from the point of interest, locating and identifying a point on the cursor corresponding to a nearest intersection between the cursor and the graph in an other direction from the point of interest, and calculating a bandwidth between the point located and identified in one direction and the point located and identified in the other direction.

2. A display system as recited in claim 1 wherein the nearest point of intersection in the one direction and the nearest point of intersection in the other direction are identified by an intensified point on the cursor.

3. A display system as recited in claim 1 further comprising:
   a readout on the display means of the bandwidth calculated by the controlling means.

4. A display system as recited in claim 1 further comprising:
   a reference marker movable along the frequency axis of the display means for marking a second point of interest on the graph, the reference marker being visually distinguishable from the marker.

5. A display system as recited in claim 4 further comprising:
   a readout on the display means of the bandwidth calculated by the controlling means.

6. A display system as recited in claim 4 wherein the controlling means has a further function of the calculating a delta frequency between the reference marker and the marker and wherein a readout of the delta frequency between the reference marker and the marker is provided on the display means.

7. A display system as recited in claim 3 wherein the readout, if no intersection is found by the controlling means in the one direction, is the frequency value of the intersection in the other direction.

8. A display system as recited in claim 3 wherein the readout, if no intersection is found by the controlling means in the other direction, is the frequency value of the intersection in the one direction.

9. A display system as recited in claim 1, wherein the controlling means further comprises means for automatically locating another peak so that additional bandwidths may be calculated.

* * * * *